(12) United States Patent
Takeda et al.

(10) Patent No.: US 11,138,144 B2
(45) Date of Patent: *Oct. 5, 2021

(54) METHODS AND SYSTEM FOR AN INTEGRATED CIRCUIT

(71) Applicant: SEMICONDUCTOR COMPONENTS INDUSTRIES, LLC, Phoenix, AZ (US)

(72) Inventors: Yukihito Takeda, Kakamigahara (JP); Tomonori Kamiya, Ichinomiya (JP)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/947,050

(22) Filed: Jul. 16, 2020

(65) Prior Publication Data

US 2020/0401552 A1 Dec. 24, 2020

Related U.S. Application Data

(63) Continuation of application No. 16/447,008, filed on Jun. 20, 2019, now Pat. No. 10,719,477.

(51) Int. Cl.
*G11C 7/10* (2006.01)
*G06F 15/78* (2006.01)
*G06F 9/38* (2018.01)
*G06F 9/35* (2018.01)

(52) U.S. Cl.
CPC .......... *G06F 15/7864* (2013.01); *G06F 9/35* (2013.01); *G06F 9/3869* (2013.01); *G11C 7/1096* (2013.01)

(58) Field of Classification Search
CPC ......... G11C 7/22; G11C 16/22; G11C 7/1096; G06F 15/7864; G06F 9/3869; G06F 9/35
USPC .............................................. 365/189.05, 195
See application file for complete search history.

(56) References Cited

U.S. PATENT DOCUMENTS

| | | | |
|---|---|---|---|
| 4,724,531 A | | 2/1988 | Angleton |
| 4,757,406 A | * | 7/1988 | Stewart ................. G06F 3/0601 360/49 |
| 4,928,185 A | * | 5/1990 | Kobayashi ......... G11B 20/1208 360/32 |
| 5,460,093 A | | 10/1995 | Prinz |
| 5,592,644 A | * | 1/1997 | Thomas ................ G06F 3/0601 365/145 |
| 5,592,645 A | * | 1/1997 | Thomas ................ G06F 3/0601 365/145 |
| 5,790,559 A | | 8/1998 | Sato |
| 5,822,550 A | | 10/1998 | Milhaupt |
| 7,315,603 B2 | * | 1/2008 | Iwase ..................... B82Y 10/00 376/233 |
| 8,331,189 B1 | * | 12/2012 | Pancoast ................. G06F 21/79 365/226 |

(Continued)

*Primary Examiner* — Michael T Tran
(74) *Attorney, Agent, or Firm* — Noblitt & Newson, PLLC

(57) ABSTRACT

Various embodiments of the present technology may provide methods and system for an integrated circuit. The system may provide a plurality of integrated circuits (i.e., slave devices) connected to and configured to communicate with a host device. Each integrated circuit may comprise a register storing a common default address. Each integrated circuit may further comprise an interface circuit configured to overwrite the default address of one integrated circuit with a new address while preventing changes to the remaining integrated circuits.

20 Claims, 6 Drawing Sheets

(56) References Cited

U.S. PATENT DOCUMENTS

Figure 1:
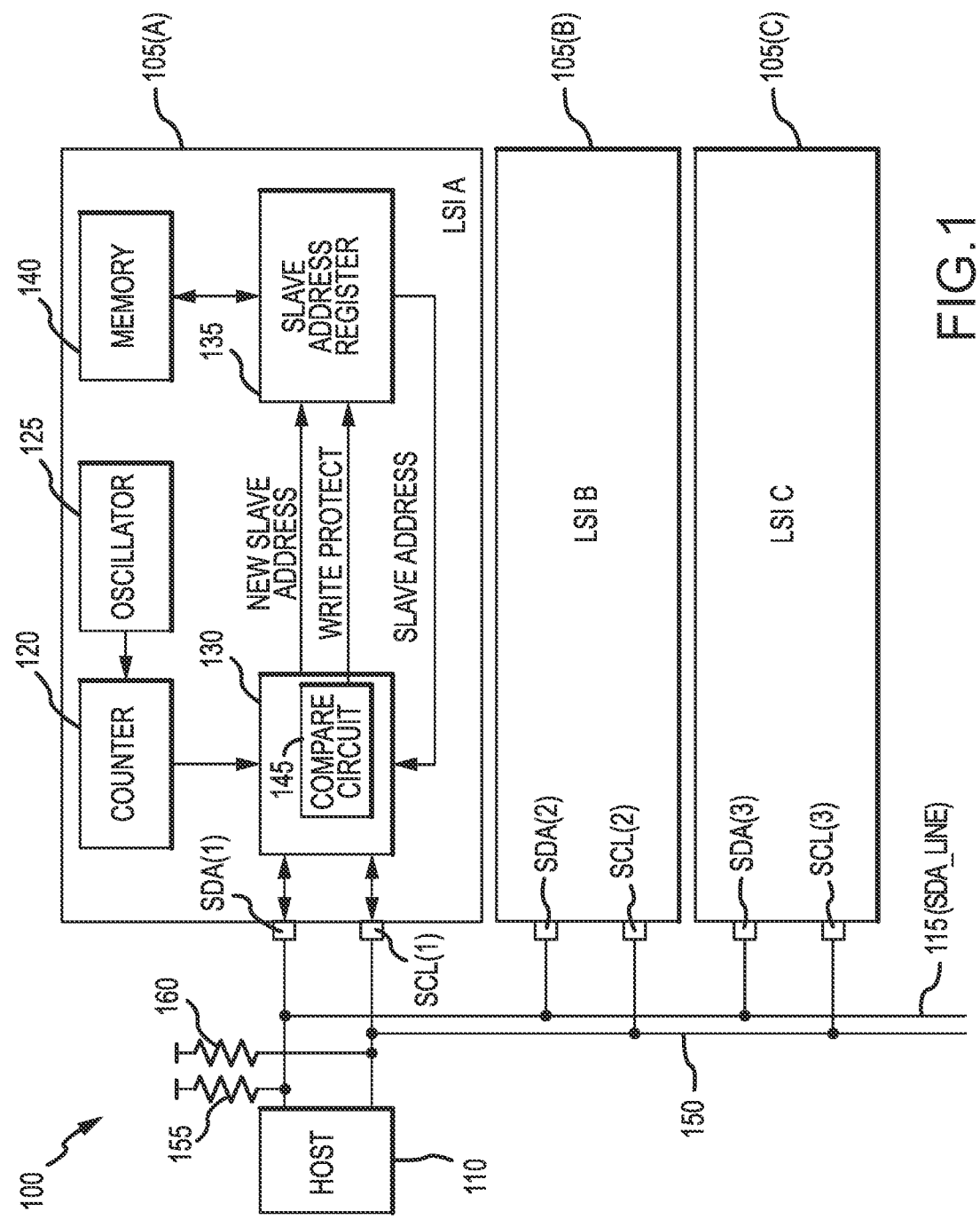

| | | | |
|---|---|---|---|
| 2003/0005241 A1* | 1/2003 | Ueno | G06F 12/1425 711/156 |
| 2005/0071592 A1* | 3/2005 | DeCaro | G06F 12/1425 711/163 |
| 2006/0002246 A1* | 1/2006 | Emberty | G11B 19/04 369/30.03 |
| 2006/0067123 A1* | 3/2006 | Jigour | G11C 7/1045 365/185.05 |
| 2006/0069933 A1 | 3/2006 | Matsuoka | |
| 2007/0233921 A1* | 10/2007 | Sugiyama | G06F 13/362 710/110 |
| 2007/0234153 A1* | 10/2007 | Kawasaki | G01R 31/318575 714/726 |
| 2008/0086590 A1* | 4/2008 | Urabe | G06F 13/1668 711/103 |
| 2008/0133842 A1* | 6/2008 | Raikin | G06F 12/1491 711/145 |
| 2008/0282119 A1* | 11/2008 | Suzuki | G11C 29/16 714/718 |
| 2008/0307237 A1* | 12/2008 | Holtzman | G06F 21/725 713/193 |
| 2008/0307495 A1* | 12/2008 | Holtzman | G06F 21/725 726/2 |
| 2008/0307508 A1* | 12/2008 | Conley | G06F 21/725 726/4 |
| 2009/0085676 A1* | 4/2009 | Nishiyama | H03K 3/356113 331/18 |
| 2009/0138963 A1* | 5/2009 | Sato | G06F 12/1441 726/17 |
| 2009/0172332 A1* | 7/2009 | Ono | G06F 12/1425 711/163 |
| 2009/0230255 A1* | 9/2009 | Lemonovich | G06F 15/17 246/167 R |
| 2010/0024000 A1* | 1/2010 | Holtzman | H04L 9/3297 726/2 |
| 2010/0077138 A1* | 3/2010 | Bauernfeind | G11B 19/122 711/104 |
| 2010/0157703 A1* | 6/2010 | Fischer | G11C 29/44 365/200 |
| 2011/0279242 A1* | 11/2011 | Krawczewicz | G06K 19/0701 340/10.6 |
| 2012/0226839 A1* | 9/2012 | Fuoco | G06F 11/348 710/110 |
| 2012/0229666 A1* | 9/2012 | Hagihara | H04N 5/378 348/222.1 |
| 2013/0051154 A1* | 2/2013 | Michael | G11C 16/26 365/185.21 |
| 2013/0134296 A1* | 5/2013 | Hagihara | H01L 27/146 250/208.1 |
| 2013/0258783 A1* | 10/2013 | Chan | G11C 5/066 365/185.18 |
| 2014/0226408 A1* | 8/2014 | Tokiwa | G11C 7/222 365/185.18 |
| 2014/0283117 A1* | 9/2014 | Hugosson | G06F 21/78 726/27 |
| 2016/0139808 A1* | 5/2016 | Stevens, Jr. | G06F 3/0673 711/163 |
| 2018/0309923 A1 | 10/2018 | Kaihatsu | |
| 2019/0188174 A1* | 6/2019 | Raja | G06F 1/08 |
| 2019/0278516 A1* | 9/2019 | Rowley | G11C 5/147 |
| 2019/0340103 A1* | 11/2019 | Nelson | G06F 11/3624 |
| 2019/0340140 A1* | 11/2019 | Sozzi | G06F 13/1663 |

\* cited by examiner

| SDA(1) | SDA(2) | SDA(3) | SDA_LINE |
|---|---|---|---|
| L | L | L | L |
| L | L | H | L |
| L | H | L | L |
| L | H | H | L |
| H | L | L | L |
| H | L | H | L |
| H | H | L | L |
| H | H | H | H |

FIG.2

| OUTPUT DATA | INPUT DATA | DIFF | WRITE PROTECT |
|---|---|---|---|
| L | L | L | L |
| H | H | L | L |
| H | L | H | H |
| L | H | NO-OCCURENCE | |

FIG.4

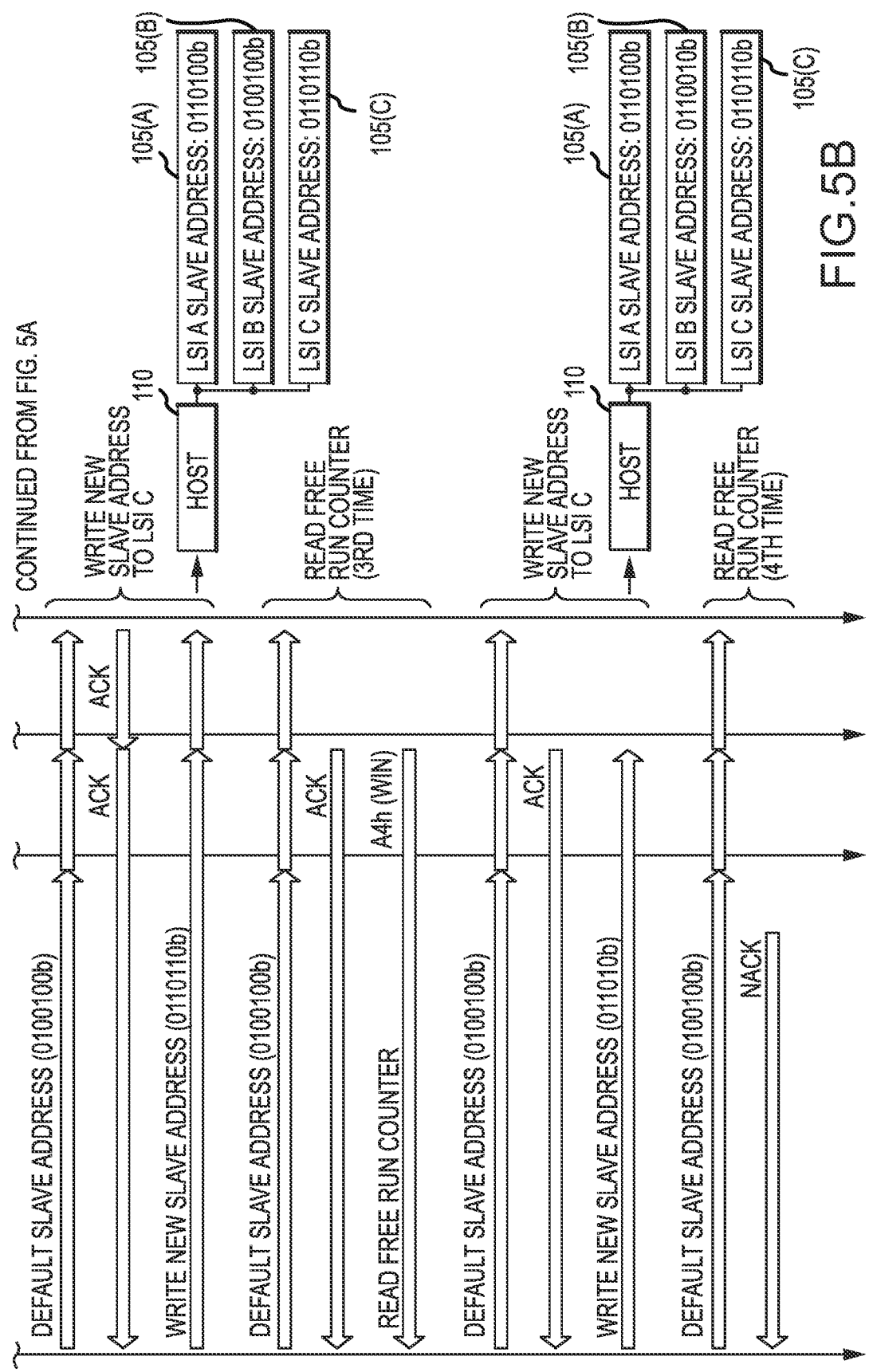

METHODS AND SYSTEM FOR AN INTEGRATED CIRCUIT

CROSS-REFERENCE TO RELATED APPLICATION

This application is a continuation of U.S. patent application Ser. No. 16/447,008, filed on Jun. 20, 2019, and incorporates the disclosure of the application in its entirety by reference.

BACKGROUND OF THE TECHNOLOGY

Many systems require multiple slave devices that are controlled by a single host device. In some cases, the slave devices are identical to each other and have a common default address. However, each slave device may need to operate independently from the other slave devices, so it may be desired to change the default address of each slave device to a new address that is unique from the addresses of the other slave devices. Conventional methods for changing the default address require additional pins and/or require independently powering the slave devices to change the default address, which increases the overall cost of each slave device and/or system.

SUMMARY OF THE INVENTION

Various embodiments of the present technology may provide methods and system for an integrated circuit. The system may provide a plurality of integrated circuits (i.e., slave devices) connected to and configured to communicate with a host device (i.e., a master device). Each integrated circuit may comprise a register for storing a common default address. Each integrated circuit may further comprise an interface circuit configured to overwrite the default address of one integrated circuit with a new address while preventing changes to the remaining integrated circuits.

BRIEF DESCRIPTION OF THE DRAWING FIGURES

A more complete understanding of the present technology may be derived by referring to the detailed description when considered in connection with the following illustrative figures. In the following figures, like reference numbers refer to similar elements and steps throughout the figures.

Figure 3:
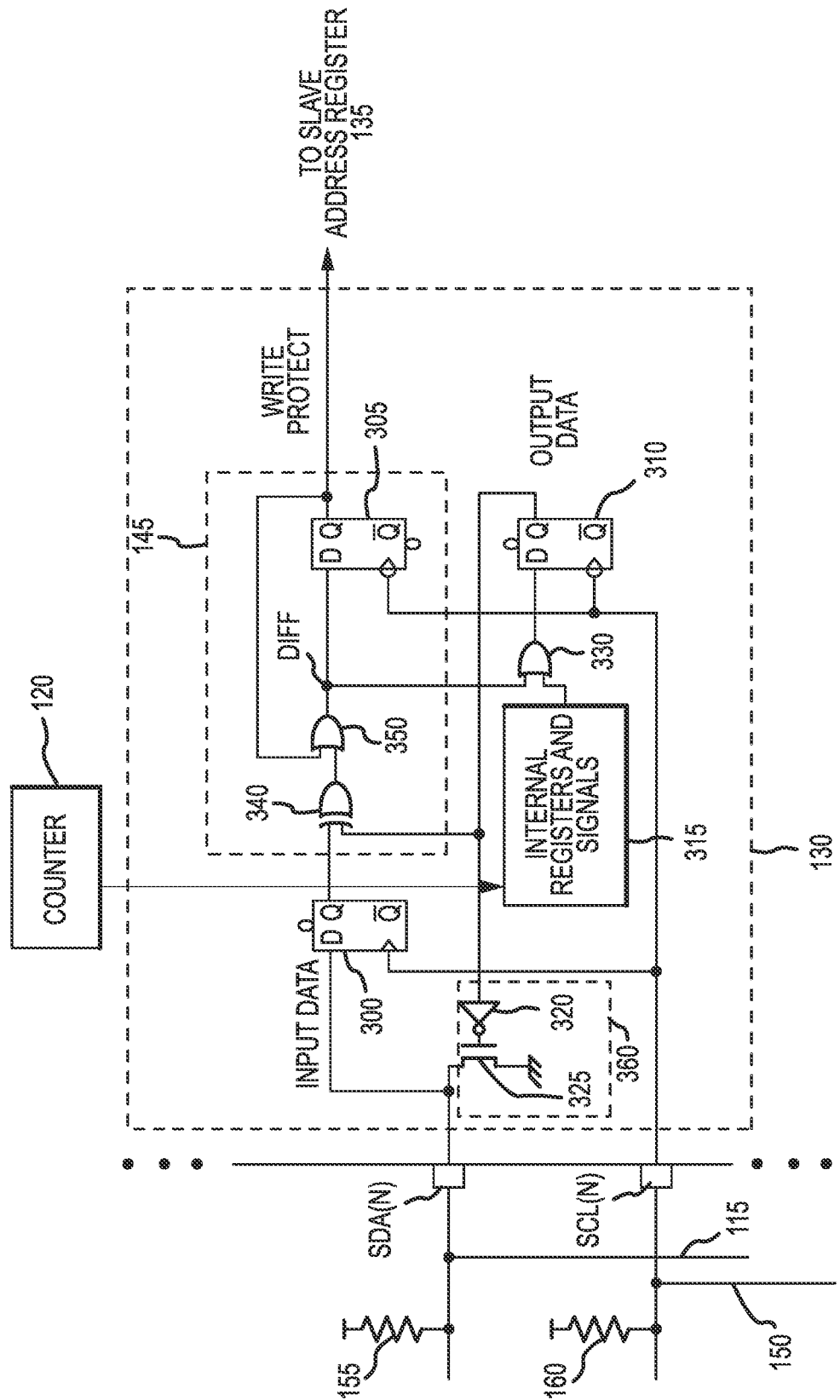
Figure 5A:
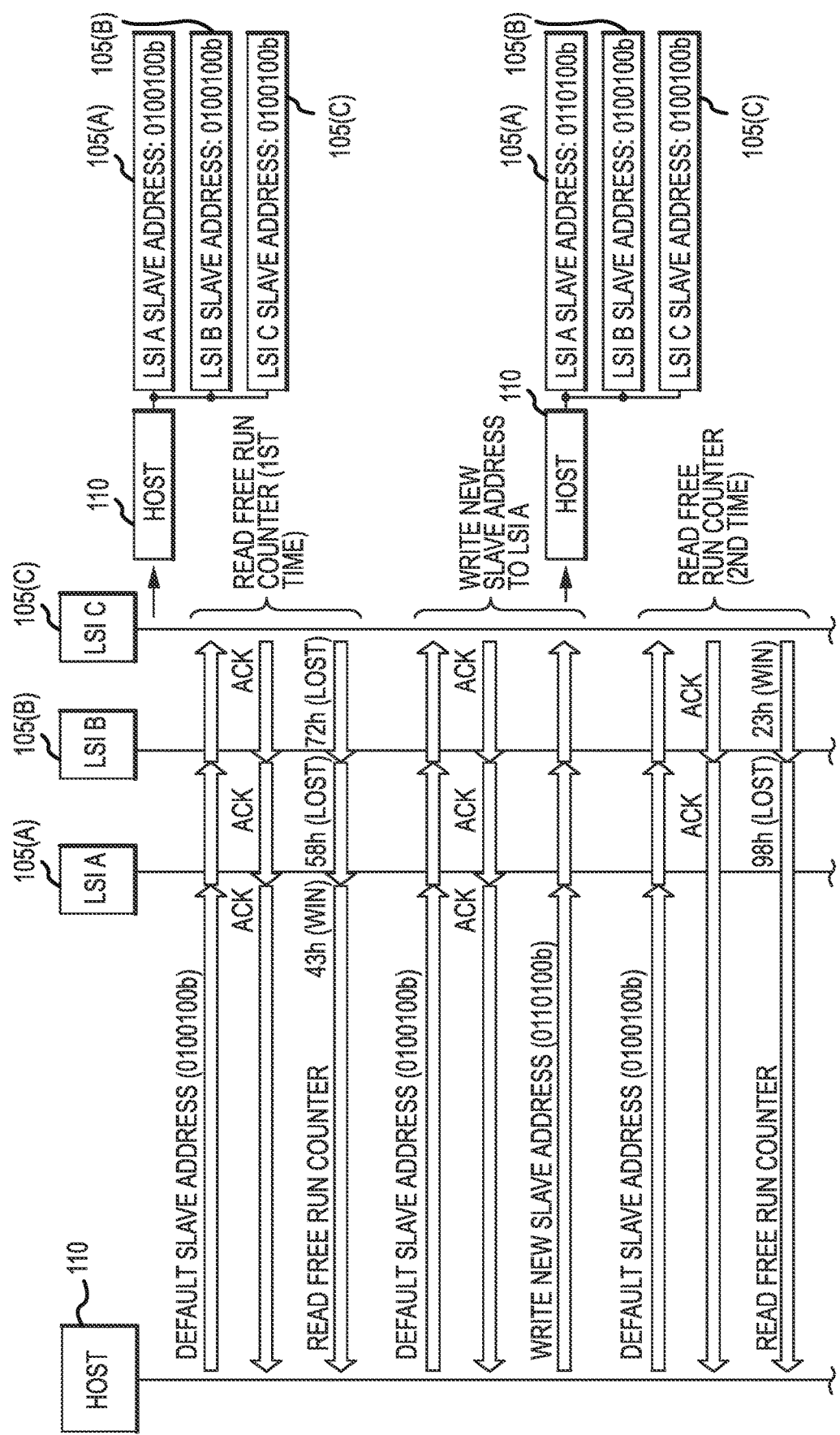

FIG. 1 representatively illustrates a system in accordance with an exemplary embodiment of the present technology;

FIG. 2 is truth table for the system in accordance with an exemplary embodiment of the present technology;

FIG. 3 representatively illustrates an interface circuit in accordance with an exemplary embodiment of the present technology;

FIG. 4 is a truth table for the interface circuit in accordance with an exemplary embodiment of the present technology; and FIGS. 5A-5B representatively illustrate communications between a host device and a plurality of integrated circuits in accordance with an exemplary embodiment of the present technology.

DETAILED DESCRIPTION OF EXEMPLARY EMBODIMENTS

The present technology may be described in terms of functional block components and various processing steps. Such functional blocks may be realized by any number of components configured to perform the specified functions and achieve the various results. For example, the present technology may employ various controllers, amplifiers, signal converters, switching devices, current sources, voltage sources, logic gates, memory devices, semiconductor devices, such as transistors, capacitors, and the like, which may carry out a variety of functions. In addition, the present technology may be integrated in any number of electronic systems, such as automotive, aviation, "smart devices," portables, and consumer electronics, and the systems described are merely exemplary applications for the technology.

Referring to FIGS. 1 and 3, an exemplary system 100 may be integrated in an electronic device (not shown), such as a camera, a cell phone, laptop computer, and the like. For example, the system 100 may comprise a host device 110 (i.e., as master device), such as a microcontroller, and a plurality of integrated circuits (i.e., a plurality of slave devices), such as a first integrated circuit 105(A), a second integrated circuit 105(B), and a third integrated circuit 105(C), wherein the integrated circuits are substantially identical.

In various embodiments, each integrated circuit 105(A), 105(B), 105(C) may communicate with the host device 110 via a data line 115 and a clock line 150. In various embodiments, the data line 115 transmits data signals between the host device 110 and each integrated circuit 105(A), 105(B), 105(C), and the clock line 150 transmits a clock signal between the host device 110 and each integrated circuit 105(A), 105(B), 105(C). According to an exemplary embodiment, the system 100 is configured as an I²C (Inter-integrated Circuit) and may comprise a serial computer bus. Accordingly, the data line 115 may be referred to as a serial data line and the clock line 150 may be referred to as a serial clock line.

According to an exemplary embodiment, each integrated circuit 105(A), 105(B), 105(C) may be configured as a driver integrated circuit for controlling an actuator (not shown). Accordingly, each integrated circuit 105(A), 105(B), 105(C), from the plurality of integrated circuits, may communicate with and control a respective actuator.

In various embodiments, the system 100 may further comprise a plurality of pull-up resistors, such as a first pull-up resistor 155 connected to the data line 115 and a second pull-up resistor 160 connected to the clock line 150.

Each integrated circuit 105(A), 105(B), 105(C) may be configured to receive and transmit various data and clock signals. For example, each integrated circuit 105(A), 105(B), 105(C) may comprise a data terminal SDA connected to the data line 115 and configured to communicate data signals, and a clock terminal SCL connected to the clock line 150 and configured to communicate clock signals.

During an initial state, all the integrated circuits 105(A), 105(B), 105(C) may be identical and have identical default addresses (i.e., default slave addresses). In addition, the integrated circuits 105 may have identical circuitry configured to overwrite the default address, store a new address (i.e., a new slave address), and communicate with the host device 110. For example, each integrated circuit 105(A), 105(B), 105(C) may comprise an oscillator 125, a counter circuit 120, a memory 140, an address register 135, and an interface circuit 130 that operate together to perform various reading and writing operations.

The oscillator 125 may be configured to generate a periodic, oscillating signal, such as a sine wave or a square wave, which may be referred to as the clock signal. The oscillator 125 may comprise any suitable circuit configured to generate a desired periodic signal. The oscillator 125 may be configured to transmit the clock signal to the counter circuit 120.

The counter circuit 120 may be configured to generate a count value according to the clock signal. The count value may be in the form of a binary number having a fixed number of bits. For example, the counter circuit 120 may have an initial count value of zero and may increment by 1 at each cycle of the clock signal. When the counter circuit 120 reaches a maximum value, it may reset to zero, and the maximum value may be based on the number of bits. The counter circuit 120 may comprise any circuit or device suitable for generating a count value.

The memory 140 may be configured to store one or more addresses. For example, at the initial state, the memory 140 may be used to store the default address. However, after the initial state, the memory may be used to overwrite the default address with a new address. The memory may comprise a non-volatile memory, such as an EEPROM.

The address register 135 may be configured to temporarily store an address (i.e., a slave address), such as the default address or the new address. The address register 135 may be in communication with the memory 140 to send and receive address information.

The interface circuit 130 may be configured to communicate directly with the host device 110 via the data and clock terminals SDA, SCL. The interface circuit 130 may be further configured to receive the count value from the counter circuit 120 and transmit the count value to the host device 110. The interface circuit 130 may be further configured to receive the new address from the host device 110 and transmit the new address to the address register 135. The interface circuit 130 may be further configured to prevent changes to the address stored in the address register 135. According to an exemplary embodiment, the interface circuit 130 may comprise a compare circuit 145 and a control circuit 360. The interface circuit 130 may further comprise a plurality of flip-flop circuits that operate in conjunction with the compare circuit 145, the control circuit 360, and other internal registers and circuitry 315.

The plurality of flip-flop circuits may comprise a first-flip circuit 300, a second flip-flop circuit 305, and a third flip-flop circuit 310. The first flip-flop circuit 300 may be connected to the data terminal SDA and the control circuit 360 via a common node. The first flip-flop circuit 300 may be configured to receive an input data signal via the common node at an input terminal (D) and the clock signal at a clock terminal (>). An output terminal (Q) of the first flip-flop circuit 300 may be connected to the compare circuit 145.

An input terminal (D) of the third flip-flop circuit 310 may be connected to the internal registers and circuitry 315 via an OR gate 330. For example, an output signal of the OR gate 330 may be transmitted to the input terminal (D) of the third flip-flop circuit 310. An output terminal (Q) of the third flip-flop circuit 310 may be connected to the control circuit 360. The third flip-flop circuit 310 may also receive the clock signal at a clock terminal (>).

The control circuit 360 may be configured to change the data signal at the data terminal SDA according to output data generated by the third flip-flop circuit 310. For example, the control circuit 360 may comprise a transistor 325 having a first source/drain terminal connected to the data terminal SDA and a second source/drain terminal connected to a reference potential, such as a ground potential. The control circuit 360 may further comprise an inverter 320 connected to a gate terminal of the transistor 325 and the third flip-flop circuit 310. For example, an input terminal of the inverter 320 may be connected to the output terminal (Q) of the third flip-flop circuit 310 and an output terminal of the inverter 320 may be connected to the gate terminal of the transistor 325.

The compare circuit 145 may be configured to enable a write protect function of the address register 135 to prevent changes to an address stored in the address register 135. The compare circuit 145 may enable the write protect function according to a signal on the data terminal SDA (i.e., a SDA signal) and the count value of the counter circuit 120. For example, the compare circuit 145 may comprise various logic circuits, such as an XOR gate 340 and an OR gate 350. The compare circuit 145 may further comprise the second flip-flop circuit 305.

A first input terminal of the XOR gate 340 may be connected to the output terminal (Q) of the first flip-flop circuit 300 and a second input terminal of the XOR gate 340 may be connected to the output terminal (Q) of the third flip-flop circuit 310. The XOR gate 340 may generate an output signal based on the input signals at its input terminals and transmit the output signal to the OR gate 350.

A first input terminal of the OR gate 350 may be connected to an output terminal of the XOR gate 340 and a second input terminal of the OR gate 350 may be connected to an output terminal (Q) of the second flip-flop circuit 305. The OR gate 350 may generate a difference output DIFF, wherein the difference output DIFF is based on the input signals at the input terminals of the OR gate 350. If the difference output DIFF is HIGH, the output signal of the second flip-flop circuit 305 and the output signal of the third flip-flop circuit 310 subsequently become HIGH regardless of the count value of the counter circuit 120.

The data terminal SDA of each integrated circuit 105(A), 105(B), 105(C) may be configured as an open-drain drive. Referring to FIG. 1, the data terminal SDA of each integrated circuit 105(A), 105(B), 105(C) is connected to the data line 115 with pull-up resistance, such as with the first pull-up resistor 155. In this configuration (referred to as a wired-AND connection), and referring to FIG. 2, the signal of the data line 115 is based on the output data signals at the data terminal SDA of each integrated circuit 105(A), 105(B), 105(C) (i.e., if the output data signals at the data terminals SDA of all the integrated circuits 105 (i.e., integrated circuits 105(A), 105(B), 105(C)) is HIGH, then the signal of the data line 115 becomes HIGH, and if the output data signal at the data terminal SDA of any one of the integrated circuits 105 is LOW, then the signal of the data line 115 becomes LOW even if the output data signals at the data terminals SDA of any remaining integrated circuits 105 is HIGH).

In operation, the host device 110 may identify or otherwise acknowledge each integrated circuit 105(A), 105(B), 105(C) and proceed to overwrite the default address of each integrated circuit 105 with the new address. According to an exemplary embodiment, the host device 110 may use the default address, initially, to communicate with the plurality of integrated circuits 105(A), 105(B), 105(C) and utilize the count values of each counter circuit 120 to sequentially change the default address to the new address. In addition, each integrated circuit 105 may be equipped to prevent changes to the new address using the write protect function.

Referring to FIGS. 1-5, at the initial state and during a first phase, the host device 110 may communicate with each integrated circuit 105(A), 105(B), 105(C) by transmitting the default address (e.g., 0100100b). At the initial state, the integrated circuits 105(A), 105(B), 105(C) have the same default address. In response to the communication from the host device 110, each integrated circuit 105(A), 105(B), 105(C) transmits a first acknowledgment signal ACK. Then, each integrated circuit 105(A), 105(B), 105(C) transmits the count value from the respective counter circuit 120. Even though the integrated circuits 105(A), 105(B), 105(C) are identical, the count value for each counter circuit 120 may vary slightly. These variations in the count value may be due to differences in the counter circuit 120 as a result of the manufacturing process. For example, the first integrated circuit 105(A) may transmit a count value of 43 (represented in hexadecimal) to the host device 110, the second integrated circuit 105(B) may transmit a count value of 58 (represented in hexadecimal) to the host device 110, and the third integrated circuit may transmit a count value of 72 (represented in hexadecimal) to the host device 110. Based on the count values for each integrated circuit 105(A), 105(B), 105(C), the wired-AND connection of the data terminals SDA, as described above, may determine a "winner" among the first, second, and third integrated circuits 105(A), 105(B), 105(C). For example, the integrated circuit 105 with the lowest count value may "win." Since the respective data terminal SDA will be LOW, the data line 115 will go LOW and the host device 110 detects the particular integrated circuit 105 that has the LOW signal (i.e., the lowest count value) on the data terminal SDA. In this case, the first integrated circuit 105(A) "wins" and both the second and third integrated circuits 105(B), 105(C) "lose."

During the first phase, the integrated circuits 105 that "lost" (e.g., the second and third integrated circuits 105(B), 105(C)) are enabled with the write protect function, while the integrated circuit that "won" (e.g., the first integrated circuit 105(A)) is subject to address changes. In an exemplary embodiment, during the present phase, the compare circuits 145 for each respective integrated circuit 105(A), 105(B), 105(C) are activated to read only the count values from the respective counter circuit 120 via the internal circuitry 315 and may be reset with a reset command from the host device 110 or start a next read access to the count values from the host device 110.

For those integrated circuits 105 that "lost" (e.g., the second and third integrated circuits 105(B), 105(C)), the respective compare circuits 145 may generate a HIGH signal to enable the write protect function which prevents changes to the current address in the address register 135. For the integrated circuit 105 that "won" (e.g., the first integrated circuit 105(A)), the respective compare circuit 145 may generate a LOW signal which allows the address in the address register 135 to be overwritten with a new address from the host device 110. For example, and referring to FIG. 4, the write protect function is enabled when the output data of the third flip-flop circuit 310 is HIGH (H), the input data of the first flip-flop circuit 300 is LOW (L), and the difference signal DIFF is HIGH. In the present example, the write protect function of each of the second and third integrated circuits 105(B), 105(C) is enabled, while the write protect function of the first integrated circuit 105(A) is disabled.

During a second phase, the host device 110 writes the new address to the integrated circuit 105 that "won." The host device 110 may transmit the default address to each integrated circuit 105(A), 105(B), 105(C) again, and each integrated circuit 105(A), 105(B), 105(C) transmits a second acknowledgment signal ACK back to the host device 110. The host device 110 may then write the new address to the integrated circuit that "won" in the first phase. In this example, the first integrated circuit 105(A) receives the new address (e.g., 0110100b).

During a third phase, the host device 110 may attempt to communicate with each integrated circuit 105(A), 105(B), 105(C) by transmitting the default address (e.g., 0100100b) again. At the current phase, the second and third integrated circuits 105(B), 105(C) have the same default address and the first integrated circuit 105(A) has an address that is different from the default address. In response to the host device 110 communication, the integrated circuits that still have the default address (e.g. in this example, the second and third integrated circuits 105(B), 105(C)) transmit a third acknowledgment signal ACK. Then, each of the second and third integrated circuits 105(B), 105(C) transmit another count value from the respective counter circuit 120 to the host device 110. For example, the second integrated circuit 105(B) may transmit a count value of 98 (represented in hexadecimal) to the host device 110 and the third integrated circuit may transmit a count value of 23 (represented in hexadecimal) to the host device 110. Based on the count values for each remaining integrated circuit (i.e., the second and third integrated circuits 105(B), 105(C)), the wired-AND connection of the data terminals SDA may determine a "winner" among the second and third integrated circuits 105(B), 105(C). For example, the integrated circuit 105 with the lowest count value may "win." In this case, the third integrated circuit 105(C) "wins" and the second integrated circuit "loses."

During the third phase, the integrated circuit 105 that "lost," is enabled with the write protect function, as described above, while the integrated circuit that "won" is subject to address changes.

During a fourth phase, the host device 110 writes a new address to the integrated circuit 105 that "won" in the third phase (e.g., third integrated circuit 105(C)). The host device 110 may transmit the default address to each integrated circuit 105(A), 105(B), 105(C) again, and the integrated circuits that still have the default address (e.g., the second and third integrated circuits 105(B), 105(C)) transmit a fourth acknowledgment signal ACK back to the host device 110. The host device 110 may then write the new address to the integrated circuit that "won" in the third phase. In this example, the third integrated circuit 105(C) receives the new address (e.g., 0110110b). After the fourth phase is completed, each of the integrated circuits 105(A), 105(B), 105(C), have different addresses.

In various embodiments, the system 100 may perform a fifth phase and a sixth phase to overwrite the default address of the second integrated circuit 105(B). During the fifth phase, the host device 110 may attempt to communicate with each integrated circuit 105(A), 105(B), 105(C) by transmitting the default address (e.g., 0100100b) again. At the current phase, the second integrated circuit 105(B) has the default address and the first and third integrated circuits 105(A), 105(C) each have a unique address, wherein the unique addresses are also different from the default address. In response to the host device 110 communication, the integrated circuits that still have the default address (e.g. in this example, the second integrated circuit 105(B)) transmits a fifth acknowledgment signal ACK. Then, the second integrated circuit 105(B) may transmit another count value from the respective counter circuit 120 to the host device 110. For example, the second integrated circuit 105(B) may transmit a count value of A4h (represented in hexadecimal). In this case, the second integrate circuit 105(B) is the only remaining integrated circuit with the default address, so the second integrated circuit 105(B) "wins."

During the sixth phase, the host device 110 may write a new address to the integrated circuit 105 that "won" in the fifth phase. The host device 110 may transmit the default address to each integrated circuit 105(A), 105(B), 105(C) again, and the integrated circuits that still have the default address (e.g., the second integrated circuits 105(B)) transmit a sixth acknowledgment signal ACK back to the host device 110. The host device 110 may then write the new address to the integrated circuit that "won" in the fifth phase. In this example, the second integrated circuit 105(B) receives the new address (e.g., 0110010b). After the sixth phase is completed, each of the integrated circuits 105(A), 105(B), 105(C), have unique addresses that are all different from each other and different from the default address.

In various embodiments, the number of phases may be based on a total number of integrated circuits 105. In addition, the system 100 may perform a final phase wherein the host device 110 attempts to communicate with each integrated circuit 105(A), 105(B), 105(C) by transmitting the default address (e.g., 0100100b) again. At this time, since none of the integrated circuits 105 have the default address, none of the integrated circuits 105 respond with an acknowledgment and the host device 110 receives a non-acknowledgment signal NACK.

In various embodiments, if at any time, two or more integrated circuits 105 transmit the same count value, a same new address is assigned to those integrated circuits. Accordingly, the host device 110 may receive a non-acknowledgment NACK earlier than expected, and if this is the case, the host device 110 resets all of the addresses of all the integrated circuits 105 to a new common address or the default address and starts the process over at the first phase.

In the foregoing description, the technology has been described with reference to specific exemplary embodiments. The particular implementations shown and described are illustrative of the technology and its best mode and are not intended to otherwise limit the scope of the present technology in any way. Indeed, for the sake of brevity, conventional manufacturing, connection, preparation, and other functional aspects of the method and system may not be described in detail. Furthermore, the connecting lines shown in the various figures are intended to represent exemplary functional relationships and/or steps between the various elements. Many alternative or additional functional relationships or physical connections may be present in a practical system.

The technology has been described with reference to specific exemplary embodiments. Various modifications and changes, however, may be made without departing from the scope of the present technology. The description and figures are to be regarded in an illustrative manner, rather than a restrictive one and all such modifications are intended to be included within the scope of the present technology. Accordingly, the scope of the technology should be determined by the generic embodiments described and their legal equivalents rather than by merely the specific examples described above. For example, the steps recited in any method or process embodiment may be executed in any order, unless otherwise expressly specified, and are not limited to the explicit order presented in the specific examples. Additionally, the components and/or elements recited in any apparatus embodiment may be assembled or otherwise operationally configured in a variety of permutations to produce substantially the same result as the present technology and are accordingly not limited to the specific configuration recited in the specific examples.

Benefits, other advantages and solutions to problems have been described above with regard to particular embodiments. Any benefit, advantage, solution to problems or any element that may cause any particular benefit, advantage or solution to occur or to become more pronounced, however, is not to be construed as a critical, required or essential feature or component.

The terms "comprises", "comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present technology, in addition to those not specifically recited, may be varied or otherwise particularly adapted to specific environments, manufacturing specifications, design parameters or other operating requirements without departing from the general principles of the same.

The present technology has been described above with reference to an exemplary embodiment. However, changes and modifications may be made to the exemplary embodiment without departing from the scope of the present technology. These and other changes or modifications are intended to be included within the scope of the present technology, as expressed in the following claims.

The invention claimed is:

1. An integrated circuit, comprising:
    a first input terminal adapted to receive an input data signal;
    a second input terminal adapted to receive a clock signal;
    a counter circuit adapted to generate a count value according to an oscillator;
    an interface circuit connected to the first and second input terminals, and configured to generate a write protect signal according to the count value; and
    a register in communication with the interface circuit and adapted to:
        store an address; and
        receive the write protect signal, wherein the write protect signal prevents changes to the address.

2. The integrated circuit according to claim 1, wherein the interface circuit comprises: a compare circuit and a plurality of flip-flop circuits; wherein the compare circuit and the flip-flop circuits are adapted to operate together to generate the write protect signal.

3. The integrated circuit according to claim 2, wherein the compare circuit is adapted to generate the write protect signal according to the input data signal and the output signal.

4. The integrated circuit according to claim 1, wherein the interface circuit comprises:
    a first flip-flop circuit, from the plurality of flip-flop circuits, connected to the first input terminal and adapted to receive the input data signal; and
    a second flip-flop circuit, from the plurality of flip-flop circuits, connected to the second input terminal and adapted to generate an output signal.

5. The integrated circuit according to claim 1, wherein the write protect signal comprises a high value and a low value.

6. The integrated circuit according to claim 5, wherein the write protect signal prevents changes to the address when:
    the output signal is a high value;
    the input data signal is a low value; and
    the write protect signal is the high value.

7. The integrated circuit according to claim 1, further comprising a non-volatile memory in communication with the register.

8. The integrated circuit according to claim 1, wherein the address of the register comprises one of a default address or a new address.

9. The integrated circuit according to claim 8, wherein the interface is adapted to change the address of the register from the default address to the new address.

10. A method for assigning addresses to plurality of slave devices connected to a host device, comprising:
transmitting a first communication signal to each slave device using a default address;
receiving a first acknowledgment signal from each slave device;
detecting one of the slave devices as having a first counter value that is the lowest-magnitude counter value relative to first counter values of the remaining slave devices; and
writing a first new address to the slave device associated with the first counter value having the lowest-magnitude counter value.

11. The method according to claim 10, further comprising:
transmitting a second communication signal to each slave device using the default address;
receiving a second acknowledgment signal from at least two slave devices;
detecting one of the slave devices as having a second counter value that is the lowest-magnitude counter value relative to second counter values of the remaining slave devices; and
writing a second new address to the slave device associated with the second counter having the lowest-magnitude counter value.

12. The method according to claim 10, further comprising receiving a non-acknowledgment signal from at least one of the slave devices.

13. A system, comprising:
a host device; and
a plurality of integrated circuits connected to the host device via a common bus, wherein each integrated circuit comprises a first input terminal adapted to receive a data signal and a second input terminal adapted to receive a clock signal, and wherein each integrated circuit is configured to:
communicate with the host using a stored address, wherein the stored address is one of a default address or a new address;
generate a count value; and
generate a write protect signal according to the count value;
wherein the host device is adapted to write the new address to one of the integrated circuits based on the generated count value.

14. The system according to claim 13, wherein each integrated circuit comprises:
a counter circuit adapted to generate the count value according to an oscillator;
an interface circuit connected to the first and second input terminals, and configured to generate a write protect signal according to the count value; and
a register in communication with the interface circuit and adapted to:
store the stored address.

15. The system according to claim 14, wherein the interface circuit comprises:
a first flip-flop circuit connected to the first input terminal and adapted to receive the data signal; and
a second flip-flop circuit connected to the second input terminal and adapted to generate an output signal.

16. The system according to claim 15, wherein the interface circuit further comprises a compare circuit connected to the first and second flip-flop circuits, wherein the compare circuit is adapted to generate the write protect signal according to the input signal and the output signal.

17. The system according to claim 16, wherein the write protect signal prevents changes to the address when:
the output signal is a high value;
the input signal is a low value; and
the write protect signal is the high value.

18. The system according to claim 14, wherein the write protect signal allows changes to the stored address of one of the integrated circuits and prevents changes to the stored address of the remaining integrated circuits.

19. The system according to claim 13, wherein the host device is further adapted to:
transmit a first communication signal to each integrated circuit using a default address;
receive a first acknowledgment signal from each integrated circuit;
detect a first lowest-magnitude count value; and
write a first new address to the integrated circuit associated with the lowest-magnitude count value.

20. The system according to claim 19, wherein the host device is further adapted to:
transmit a second communication signal to each integrated circuit using the default address;
receive a second acknowledgment signal from at least two integrated circuits;
detect a second lowest-magnitude count value; and
write a second new address to the integrated circuit associated with the lowest-magnitude count value.

* * * * *